(12) United States Patent
Hooper et al.

(10) Patent No.: US 7,900,521 B2
(45) Date of Patent: Mar. 8, 2011

(54) EXPOSED PAD BACKSIDE PRESSURE SENSOR PACKAGE

(75) Inventors: Stephen R. Hooper, Mesa, AZ (US); James D. MacDonald, Chandler, AZ (US); William G. McDonald, Payson, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 58 days.

(21) Appl. No.: 12/368,402

(22) Filed: Feb. 10, 2009

(65) Prior Publication Data

US 2010/0199777 A1 Aug. 12, 2010

(51) Int. Cl.
*G01L 7/00* (2006.01)
(52) U.S. Cl. .......................................... 73/756
(58) Field of Classification Search .................. None
See application file for complete search history.

(56) References Cited

U.S. PATENT DOCUMENTS

| | | | |
|---|---|---|---|
| 4,656,454 A | 4/1987 | Rosenberger | |
| 5,150,438 A | 9/1992 | Brown | |
| 5,340,993 A | 8/1994 | Salina et al. | |
| 5,437,189 A | 8/1995 | Brown et al. | |
| 5,438,877 A | 8/1995 | Vowles et al. | |
| 5,454,270 A | 10/1995 | Brown et al. | |
| 5,465,626 A | 11/1995 | Brown et al. | |
| 5,489,800 A | 2/1996 | Brown et al. | |
| 5,545,893 A | 8/1996 | Brown et al. | |
| 5,677,245 A | 10/1997 | Brown et al. | |
| 5,889,658 A * | 3/1999 | Sullivan et al. ............... | 361/773 |
| 6,148,673 A | 11/2000 | Brown | |
| 6,201,467 B1 | 3/2001 | Winterer et al. | |
| 6,917,097 B2 | 7/2005 | Chow et al. | |
| 6,949,816 B2 | 9/2005 | Brown et al. | |
| 7,030,469 B2 * | 4/2006 | Mahadevan et al. .......... | 257/659 |
| 7,033,866 B2 | 4/2006 | Chow et al. | |
| 7,060,216 B2 | 6/2006 | Schuurmans | |
| 7,261,003 B2 | 8/2007 | McDonald et al. | |
| 2004/0118214 A1 | 6/2004 | McDonald et al. | |
| 2004/0207054 A1 | 10/2004 | Brown et al. | |
| 2005/0012183 A1 | 1/2005 | Chow et al. | |
| 2005/0067676 A1 * | 3/2005 | Mahadevan et al. .......... | 257/659 |

(Continued)

FOREIGN PATENT DOCUMENTS

DE          69526999          10/2002

(Continued)

OTHER PUBLICATIONS

Freescale Semiconductor, Integrated Silicon Pressure Sensor On-Chip Signal Conditioned, Temperature Compensated, and Calibrated, MPXV4115V, Rev. 2, May 2005.

(Continued)

*Primary Examiner* — Andre J Allen
(74) *Attorney, Agent, or Firm* — Hamilton & Terrile, LLP; Michael Rocco Cannatti

(57) ABSTRACT

A method and apparatus are described for fabricating an exposed backside pressure sensor (30) which protects interior electrical components (37) formed on a topside surface of a pressure sensor transducer die (31) from corrosive particles using a protective gel layer (38) and molding compound (39), but which vents a piezoresistive transducer sensor diaphragm (33) formed on a backside of the pressure sensor transducer die (31) through a vent hole (42) formed in an exposed die flag (36), enabling the sensor diaphragm (33) to directly sense pressure variations without the influence of a protective gel.

20 Claims, 6 Drawing Sheets

U.S. PATENT DOCUMENTS

| | | |
|---|---|---|
| 2005/0121756 A1 | 6/2005 | Chow et al. |
| 2006/0082451 A1 | 4/2006 | Shaw |
| 2007/0222009 A1 | 9/2007 | Kvisteroy |
| 2007/0277623 A1 | 12/2007 | McDonald et al. |
| 2008/0173096 A1 | 7/2008 | Sato et al. |

FOREIGN PATENT DOCUMENTS

| | | |
|---|---|---|
| EP | 0676628 A2 | 10/1995 |
| EP | 0700100 A2 | 3/1996 |
| EP | 1719993 A1 | 6/2005 |
| JP | 05190872 A | 7/1993 |
| JP | 7280681 | 10/1995 |
| JP | 8078723 | 3/1996 |
| JP | 8236805 | 9/1996 |
| JP | 09119875 A | 5/1997 |
| JP | 10274580 A | 10/1998 |
| JP | 200649694 | 2/2006 |
| WO | WO 98/29711 A1 | 7/1998 |
| WO | 2008089969 A2 | 1/2008 |

OTHER PUBLICATIONS

M. Shaw, et al., "Package Design of Pressure Sensors for High Volume Consumer Applications", STMicroelectronics, Corporate Packaging and Automation (CPA), Agrate Italy, 2008 Electronic Components and Technology Conference, pp. 834-840.

PCT Application No. PCT/US2010/021508; Search Report and Written Opinion dated Oct. 18, 2010.

* cited by examiner

US 7,900,521 B2

EXPOSED PAD BACKSIDE PRESSURE SENSOR PACKAGE

BACKGROUND OF THE INVENTION

1. Field of the Invention

The present invention is directed in general to the field of pressure sensor devices. In one aspect, the present invention relates to a micro-electro mechanical system (MEMS) pressure sensor having an improved packaging scheme for producing low cost tire pressure monitoring systems for the automotive industry.

2. Description of the Related Art

Micro-Electro-Mechanical Systems (MEMS) technology is increasingly used to integrate mechanical elements, sensors, actuators, and electronics on a common silicon substrate through microfabrication technology. For example, MEMS pressure sensors can be used to automatically measure car tire pressure while the vehicle is moving so that the operators can be notified if the tires are not properly inflated. Improper tire inflation can cause tire damage, increased fuel consumption, reduced vehicle stability and/or vehicle accidents if the tires blow out. By providing real-time air pressure information, the vehicle operator can properly maintain the air pressure of the tires and safely operate the vehicle. However, there are significant technical challenges to placing a pressure sensor in a tire to monitor the air pressure since the environment in the tire where the sensor is placed is quite harsh and corrosive. To protect against the corrosive environment, internal tire pressure sensors are provided with various coatings, encapsulants, or diaphragms made from various elastic gels, polymers, or other materials, but these protection schemes add to the complexity of manufacturing such sensors, resulting in increased cost, reduced reliability, impaired centrifugal performance, and/or reduced ability to measure the air pressure (e.g., due to the presence of a thick coating on the sensing diaphragm).

Accordingly, a need exists for an improved pressure sensor device and manufacture method which overcomes the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
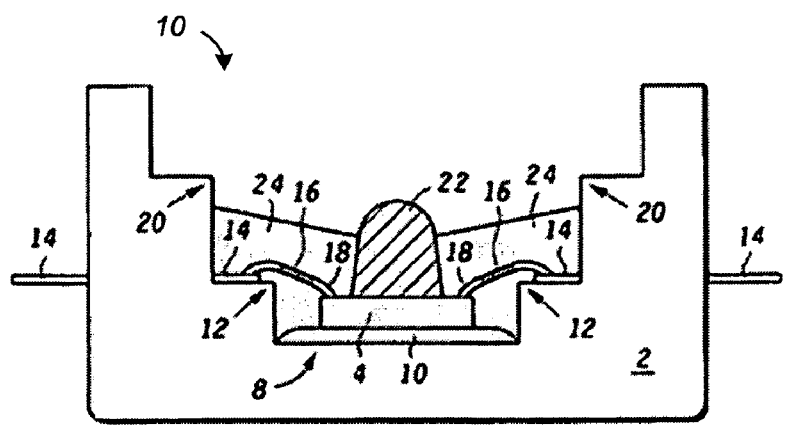
FIG. 1 illustrates a side view of a sensor package having a protective gel deposited over the sensor package.

A method and apparatus are described for fabricating and packaging an integrated silicon pressure sensor having a backside piezoresistive transducer (PRT) that is directly exposed to the environment through a vent hole formed in the exposed die pad. In selected embodiments, a backside PRT die is attached to an exposed flag on a lead frame so that the pressure sensor diaphragm on the back of the PRT die is directly vented to the environment through a vent hole in the exposed flag. By virtue of forming the pressure sensor diaphragm on the monocrystalline silicon backside of the PRT die, there is no need to form a protective film or gel over the pressure sensor diaphragm since the monocrystalline silicon on the backside is a relatively robust material. In addition, the relatively sensitive circuitry (e.g., the metal lines, etc.) is on the top of the PRT die and therefore protected from the environment. The use of an exposed flag and vent hole also eliminates the need for using a core pin during molding to expose the sensor, thereby reducing the likelihood of cracking the PRT sensor during fabrication. While the bottom of the PRT die is exposed to the environment without a protective gel or coating, the top of the PRT die may be covered with a molding compound or gel for protection from the environment using any desired packaging scheme, including but not limited to QFN (Quad Flat No leads), SOIC (Small-Outline Integrated Circuit), QFP (Quad Flat Package) or LGA (Land Grid Array) packaging. As will be appreciated, the application of the gel coating on the top of the PRT die provides stress relief from the molding compound, but is not required if the PRT die can tolerate the molding compound stress.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of an integrated silicon pressure sensor and associated packaging without including every device feature or geometry in order to avoid limiting or obscuring the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted integrated silicon pressure sensor die and associated packaging structures. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Referring now to FIG. 1, there is shown side view of a sensor package 10 having a protective gel 24 deposited over the sensor package around sacrificial gel dome 22. The pressure sensor package 10 includes a durable housing 2 that protects a pressure sensor 4 from a corrosive environment that may exist outside of housing 2 when measuring the pressure for automotive, chemical, biological, or medical applications. For example, the environment inside a tire is potentially corrosive to the metal and semiconductor components of pressure sensor 4, due to the presence of tire mounting paste, tire mounting and general purpose lubricants, tire de-mounting fluid, break fluid, degreaser, wheel cleaner, mineral oil, moisture, and/or other contaminants in the interior of the tire. These contaminants could damage the operation of pressure sensor 4 which includes metal and semiconductor components that can be damaged when placed in the corrosive environment. Placing pressure sensor 4 within an interior chamber of durable housing 2 helps protect the pressure sensor 4 from the corrosive environment.

As depicted, the pressure sensor 4 is mounted to a bottom recess 8 of the durable housing 2 with an adhesive material 10. The durable housing 2 also includes a pair of shelves 12 adjacent to pressure sensor 4 that support a plurality of electrical leads 14 which extend from the interior chamber, through durable housing 2, and into the exterior environment for communicating with external circuitry. In addition, the durable housing includes a cap surface 20 that mechanically supports a cap structure (not shown) that fits within the interior chamber. The electrical leads 14 are electrically coupled to the pressure sensor by wires 16, such as by thermosonically bonding wires 16 to electrical leads 14 and bond pads 18 on the die of sensor 4. While the durable housing 2 can be made with a material that is resistant to the exterior corrosive environment, the wires 16, bond pads 18, and electrical leads 14 are nonetheless vulnerable to corrosion from corrosive particulates that exist in the exterior environment. After the pressure sensor 4, electrical leads 14, wires 16, and bond pads 18 have been secured to durable housing 2, a sacrificial gel dome 22 is placed over pressure sensor 4 to directly cover a sensor diaphragm 28 (shown in FIG. 2). After forming the sacrificial gel dome 22, a protective gel 24 is dispensed within the interior chamber of durable housing 2 to a depth such that it covers electrical leads 14, bond pads 18, and wires 16. The function of protective gel 24 is to form a protective barrier for electrical leads 14, bond pads 18, and wires 16 against any corrosive particulates that may penetrate durable housing 2 and vented cap structure to reach the interior chamber. In the event that corrosive particulates penetrate into the interior chamber, protective gel 24 inhibits the corrosive particulates from coming into contact with electrical leads 14, bond pads 18, and wires 16, thereby deterring corrosion from occurring.

Figure 2:
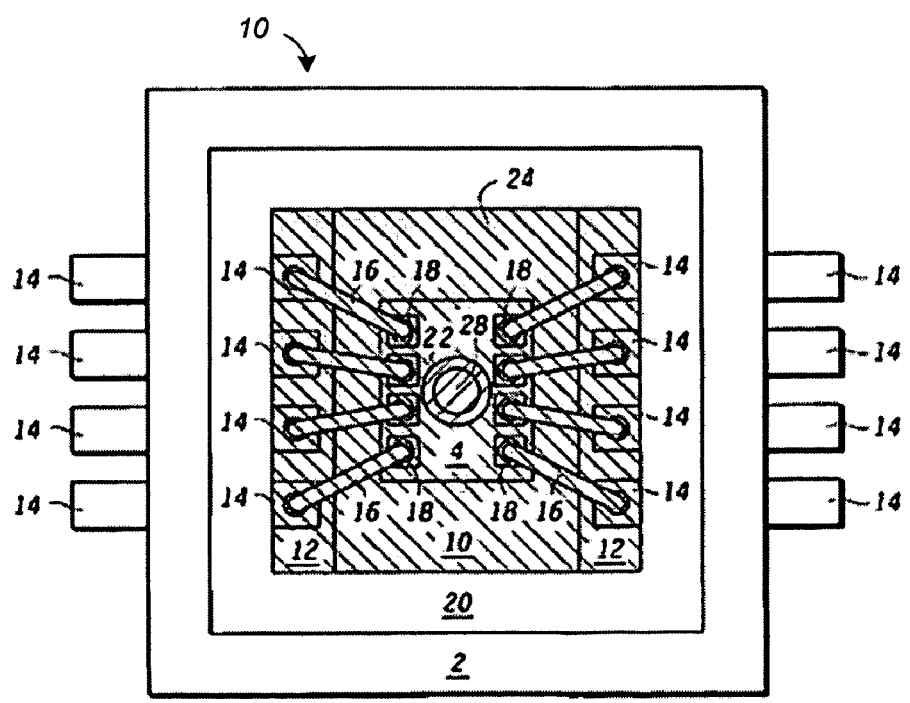
FIG. 2 illustrates a top view of the sensor package shown in FIG. 1.

FIG. 2 illustrates a top view of the sensor package 10 shown in FIG. 1 where the protective gel 24 is deposited around the sacrificial gel dome 22 that is positioned over the sensor diaphragm 28. As formed, the protective gel 24 is dispensed over the electrical leads 14, bond pads 18, and wires 16 without covering the top portion of sacrificial gel dome 22. The sacrificial gel dome 22 may be formed with a flexible material that allows external pressure changes to be detected by the sensor diaphragm 28, or may be formed with a soluble material that is subsequently removed or dissolved with a fluid to form a vent to the sensor diaphragm 28. In either case, a vented cap structure (not shown) is affixed to the cap surface 20 on the interior chamber so that the sensor diaphragm 28 can detect and respond to pressure variations by producing electrical signals that are passed through durable housing 2 by electrical leads 14 to an outside circuit. As will be appreciated, there are manufacturing challenges to properly locating and forming one or more gel coatings to protect the electrical leads 14, bond pads 18, and wires 16 from corrosive environment, and if the gel dome 22 is retained over the sensor diaphragm 28, the sensitivity of the pressure sensor may be reduced.

Figure 3:
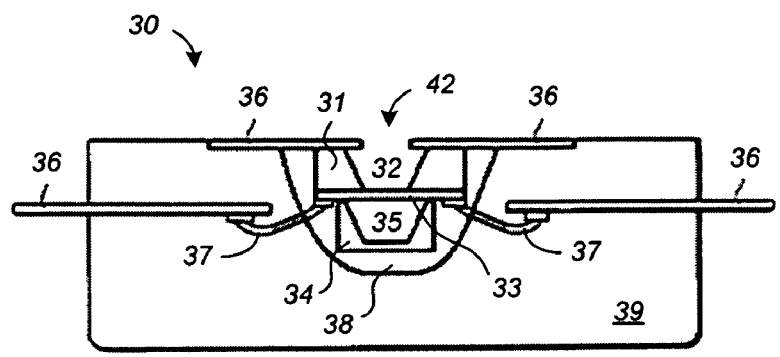
FIG. 3 illustrates a side view of a sensor package having an exposed pad backside pressure sensor and a topside gel coating in accordance with selected embodiments of the present invention.

FIG. 3 illustrates a side view of a sensor package 30 having an exposed pad backside pressure sensor 33 and a topside gel coating 38 in accordance with selected embodiments of the present invention. The backside pressure sensor 33 may be implemented as a MEMS piezoresistive transducer (PRT) element by affixing a substrate structure 31 to a cap structure 34. Though shown as a simplified cross-section, it will be appreciated that wafer fabrication techniques may be used to form the substrate structure 31 from a monocrystalline silicon substrate material having first and second surfaces. On the first surface of the substrate structure 31 (shown as the "topside" or bottom surface in FIG. 3), a resistive-type sensor circuit is formed, such as by forming semiconductor features (e.g., circuit elements) and metal connection lines into a Wheatstone bridge configuration (not shown) which is generally understood to refer to an electrical bridge consisting of two voltage divider branches connected in parallel with the same power supply. Persons having ordinary skill in the art will appreciate that the resistive-type sensor circuit may be formed on the first surface of the substrate structure 31 using any desired processing techniques, including but not limited to depositing, growing, masking, patterning, implanting, and/or etching various semiconductive, insulative, and/or conductive materials. On the second surface of the substrate structure 31 (shown as the "backside" or upper surface in FIG. 3), an opening 32 is formed in the monocrystalline silicon substrate using any desired selective etching technique, such as applying a reactive ion etch process to a patterned etch mask formed on the second surface. The selective etch process is controlled so that the opening 32 defines a membrane 33 on which the sensor circuit is formed to detect pressure-induced stress variations. In similar fashion, wafer fabrication techniques may be used to form the cap structure 34 from a monocrystalline silicon substrate material so that an opening 35 is formed using any desired selective etching technique. After singulating the substrate structure and cap structure wafers, the individual die 31, 34 may positioned and affixed to one another so that bond pads on the first surface of the substrate structure 31 may be bonded to electrical wires 37. While any desired bonding or adhesive technique may be used to affix the substrate structure die 31 and cap structure die 34, in an example embodiment, a glass frit wafer bonding process is used. Thus formed, the resistive-type sensor circuit detects deflections in the membrane 33 caused by changes in the pressure in the opening 32 as compared to the reference pressure in sealed opening 35.

Once the substrate structure die 31 and cap structure die 34 are affixed together into a sensor assembly, the assembly is mounted or affixed to the exposed die flag portion of the electrical leads 36 so that the opening 32 in the backside of the substrate structure 31 is aligned with an opening or vent hole 42 in the exposed die flag. Again, any desired technique may be used to affix the sensor assembly 31, 34 to the exposed die flag, such as, for example, using a die bonding adhesive material or layer (not shown). The sensor assembly 31, 34 is then electrically connected to adjacent electrical leads 36, such as by thermosonically bonding electrical wires 37 between the electrical leads 36 and the bond pads on the substrate structure 31. At this point in the fabrication process, a protective gel 38 may be dispensed to such a thickness that it covers the top of the sensor assembly 31, 34, the bond pads on the substrate structure 31, and at least part of the electrical wires 37. One function of protective gel 38 is to form a protective barrier for at least part of the electrical leads 36 and bond pads and wires 37 against any corrosive particulates or fluids, thereby deterring corrosion from occurring. Another function of the protective gel 38 is to provide stress relief from the subsequently formed molding compound. In selected embodiments, the protective gel 38 is a silicon-based gel, though other types of protective gels can be used.

As further illustrated in FIG. 3, the gel-covered sensor assembly 31, 34 and connected electrical leads 36 are encapsulated with an insulating package body or molding 39 which may be formed by transfer molding, compression molding, injection molding, or otherwise forming an encapsulant to seal and protect the sensor circuitry on the "topside" of the substrate structure 31 from moisture, contamination, corrosion, and mechanical shock, but without covering or sealing the vent hole opening 42 in the exposed die flag portion of the electrical leads 36. For example, after affixing and electrically connecting the sensor assembly 31, 34 to the electrical leads 36 and dispensing the protective gel coating 38, an encapsulation process is performed to cover the sensor assembly 31, 34 with a mold compound or mold encapsulant. The mold encapsulant may be a silica-filled resin, a ceramic, a halide-free material, or some other protective encapsulant layer. The mold encapsulant is typically formed by molding thermosetting materials in a process where a plastic is softened by heat and pressure in a transfer chamber, then forced at high pressure through suitable sprues, runners, and gates into a closed mold for final curing. The mold encapsulant may also be formed by using a liquid which is then heated to form a solid by curing in a UV or ambient atmosphere, or by using a solid that is heated to form a liquid and then cooled to form a solid mold. As will be appreciated, any desired encapsulant process may be used to protect the top of the sensor assembly 31, 34 from the environment, provided that the vent hole opening 42 remains open. This may be accomplished by forming the molding compound 39 to be flush with the exposed die flag portion of the electrical leads 36 so that none of the gel 38 or molding compound 39 fills the vent hole 42 or opening 32.

Figure 4:
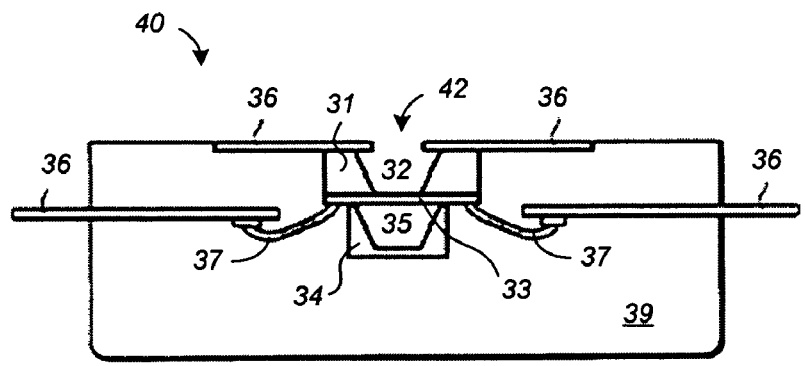
FIG. 4 illustrates a side view of a sensor package having an exposed pad backside pressure sensor in accordance with selected embodiments of the present invention.

The presence of the protective gel coating 38 improves the performance of the PRT pressure sensor over different temperature and pressure conditions. However, there may be applications where the PRT sensor is formed without using a protective gel coating, especially where the sensor assembly 31, 34 can tolerate the molding compound stress. An example embodiment is shown in FIG. 4 which illustrates a side view of a sensor package 40 having an exposed pad backside pressure sensor 33 in accordance with selected embodiments of the present invention. As described above with reference to FIG. 3, the backside pressure sensor 33 may be implemented as a MEMS piezoresistive transducer (PRT) element by affixing a substrate structure 31 to a cap structure 34, mounting the backside of the resulting sensor assembly 31, 34 to the exposed die flag portion of the electrical leads 36 to align the opening 32 and vent hole 42, and then thermosonically bonding electrical wires 37 between the electrical leads 36 and the bond pads on the substrate structure 31. However, instead of forming a protective gel coating, the insulating package body or molding compound 39 is formed directly on the sensor assembly 31, 34 and electrical wires 37 by transfer molding, compression molding, injection molding, or otherwise. This process still forms an encapsulant to seal and protect the sensor circuitry on the "topside" of the substrate structure 31 from moisture, contamination, corrosion, and mechanical shock, but without covering or sealing the vent hole opening 42 in the exposed die flag portion of the electrical leads 36.

Figure 5:
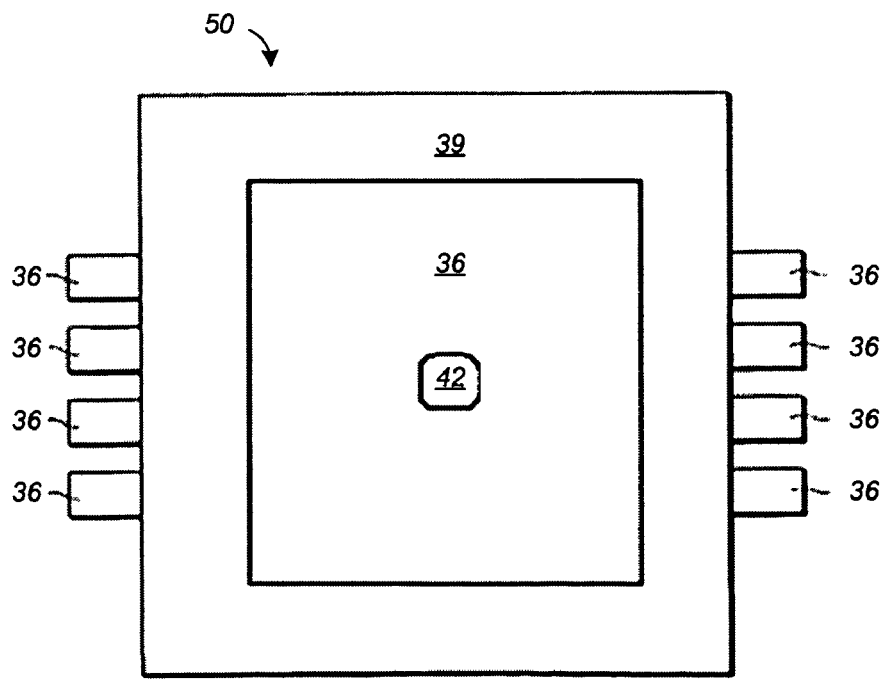
FIG. 5 illustrates a top view of the sensor package shown in FIG. 3 or 4.

FIG. 5 illustrates a top view of a sensor package 50 which corresponds to either of the sensor packages 30, 40 shown in FIG. 3 or 4, respectively. As depicted, the sensor package 50 includes an exposed die flag portion of the electrical leads 36 in which is formed an opening or vent hole 42 that is centered in the exposed die flag portion. The exposed die flag portion is flush with and sealed against the insulating package body or molding 39, thereby protecting the underlying electrical leads, bond pads and wires from corrosive particles or fluids. It should be noted that the vent hole 42 allows communication of pressure through the opening 32 and directly to the sensor membrane or diaphragm 33. However, because the resistive-type sensor circuit is formed on the opposite surface of the substrate structure 31, the vent hole 42 does not expose the semiconductor or metal components of the resistive-type sensor circuit to corrosion. Together, vent 34 and protective gel 32 shield the sensitive components of pressure sensor 4 from corrosive elements while allowing unfettered pressure sensings by diaphragm 28.

Figure 6:
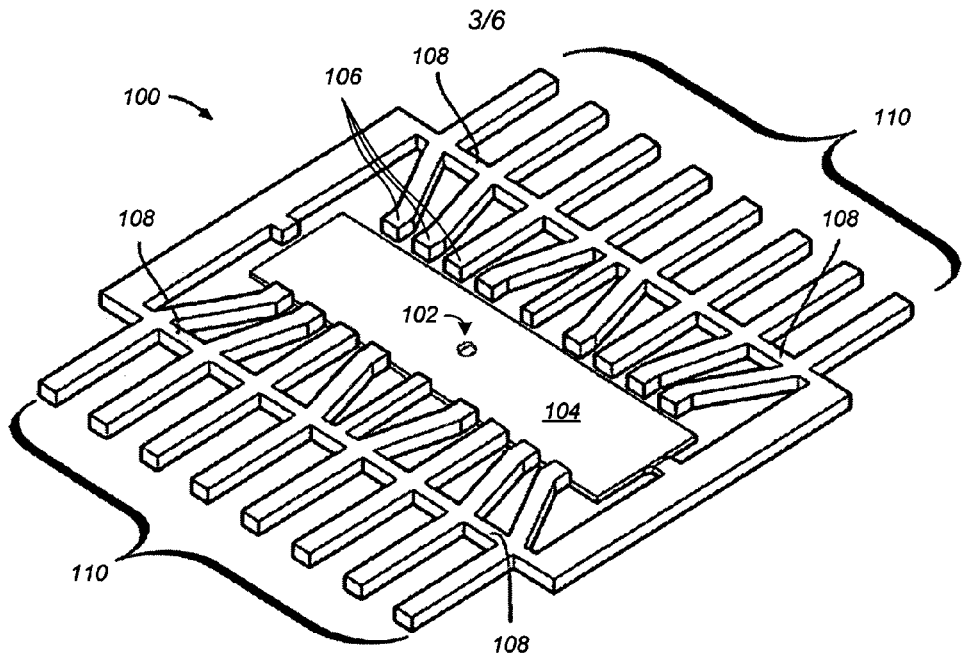
FIG. 6 is an isometric top view of an example lead frame having a vent hole formed in the die flag that is suitable for use in conjunction with selected embodiments of the present invention.

To illustrate an example fabrication sequence for packaging an integrated silicon pressure sensor having a backside PRT sensor, reference is now made to FIG. 6 which provides an isometric top view of an example lead frame 100 having a vent hole 102 formed in the die flag 104 that is suitable for use in conjunction with selected embodiments of the present invention. As will be appreciated, the lead frame 100 and vent hole 102 may be produced by stamping or etching a portion of a metal (e.g., copper or copper alloy) strip with a predetermined pattern of lead frame features (e.g., die attach flags, interior electrical contacts, exterior electrical contacts, etc.). In selected embodiments, the exposed die flag 104 of the copper lead frame may be plated on at least the exterior surface (e.g. with NiPdAu). The depicted lead frame 100 includes a plurality of interior electrical contacts 106 and a plurality of exterior electrical contacts 110 that are connected to a dam bar 108 which is provided around the perimeter of lead frame 100. As will be appreciated, the dam bar 108 is later removed (i.e., trimmed) from lead frame 100 during device processing to physically separate and electrically isolate adjacent ones of contacts 102 and 110. The depicted lead frame 100 also includes a die attach flag 104 that is connected to the dam bar 108. As shown, the die attach flag 104 is recessed below the remainder of the lead frame so that die flag remains exposed even after the remainder of the lead frame 100 is encapsulated.

Figure 7:
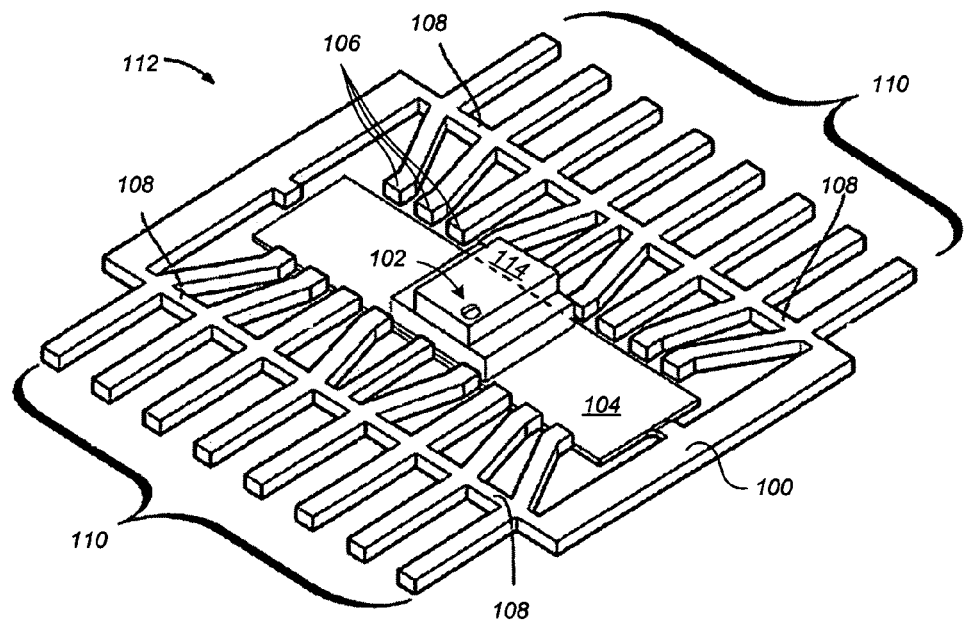
FIG. 7 is an isometric top view of a lead frame assembly having a backside piezoresistive transducer (PRT) die mounted in alignment with the vent hole in the die flag.
Figure 8:
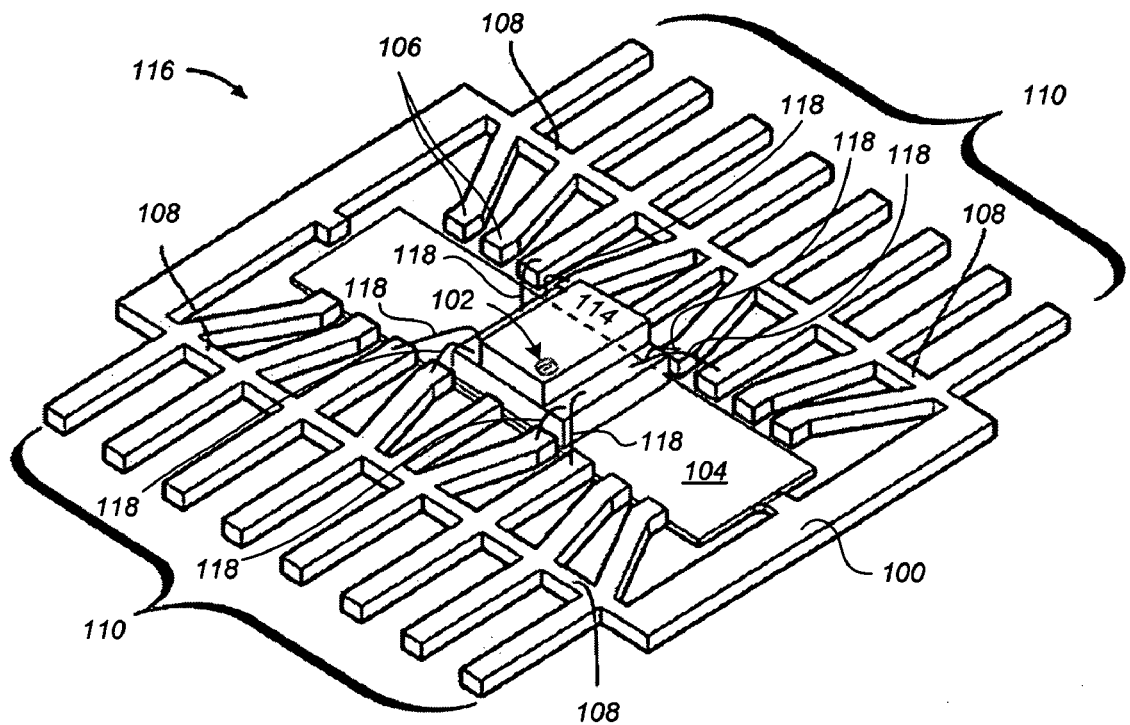
FIG. 8 is an isometric top view of the lead frame assembly after wirebond connections are made between the backside PRT die and the lead frame.

The die attach flag 104 is configured to support an integrated circuit (IC) die or device, such as an application specific integrated circuit (ASIC). In particular and as shown in FIG. 7 with the isometric top view of a lead frame assembly 112, a backside piezoresistive transducer (PRT) die 114 is mounted in alignment with the vent hole 102 in the die flag 104. Though not shown explicitly in FIG. 7, the backside PRT die 114 includes a topside surface on which the sensor circuitry and bond pads are formed, and also includes a backside in which an opening is formed to define a pressure sensor membrane. Conventional die bonding may be used to secure the backside PRT die 114 to the die attach flag 104 with a suitable bonding material (e.g., epoxy, glass, gold preform, solder paste, etc.). After being secured to flag 104, the backside PRT die 114 is wire bonded to a selected group of interior electrical contacts 106 with, for example, segments of gold wire as shown in FIG. 8 which illustrates an isometric top view of the lead frame assembly 116 after wirebond connections 118 are made between the backside PRT die 114 and the interior electrical contacts 106. By positioning and affixing the backside PRT die 144 in alignment with the vent hole 102 in the die flag 104, the pressure sensor membrane is vented directly to the environment.

Figure 9:
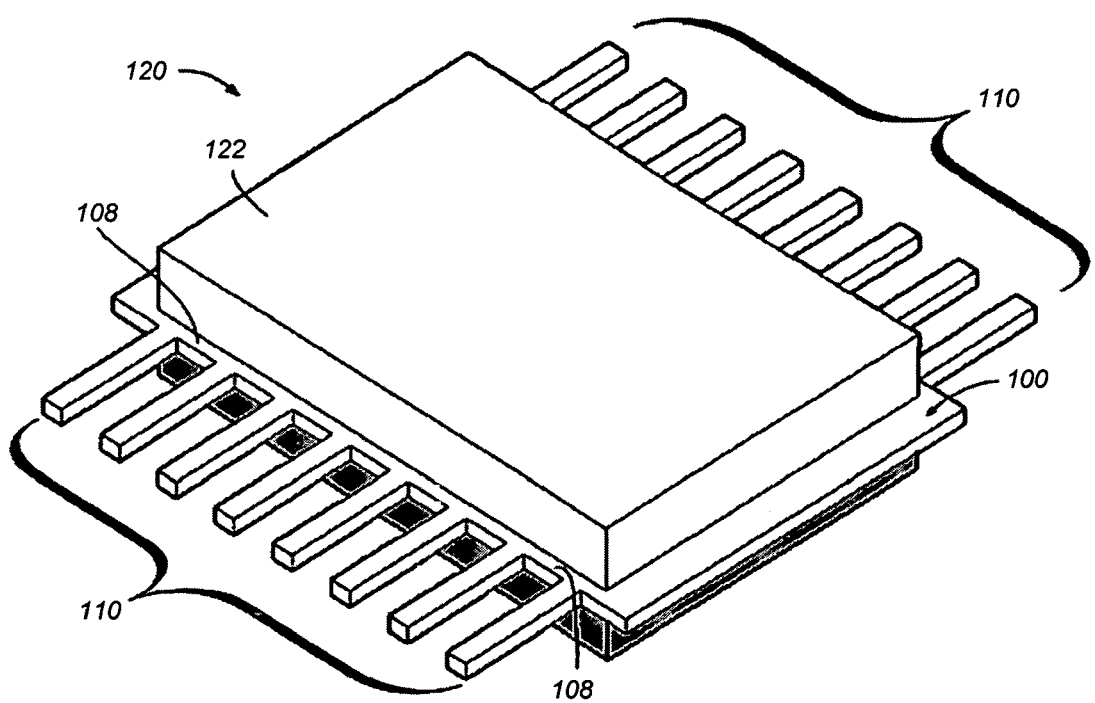
FIG. 9 is an isometric top view of an encapsulated device in which the backside PRT die and lead frame are encapsulated with a molding compound, leaving the pressure sensor on the backside PRT die exposed to the environment through the vent hole in the die flag.
Figure 10:
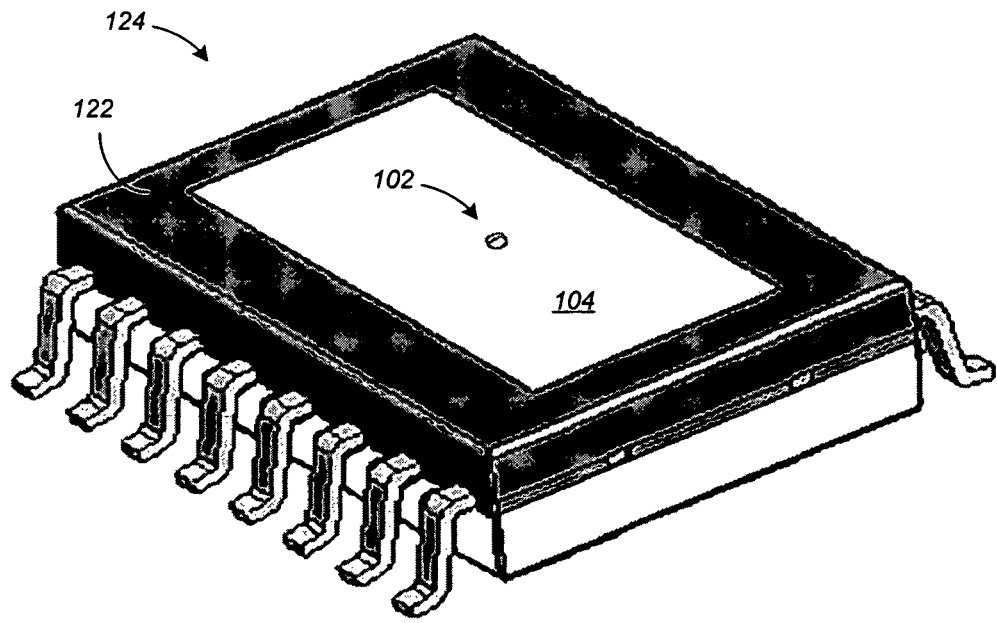
FIG. 10 is an isometric bottom view of an encapsulated device showing the vent hole in the die flag through which the pressure sensor on the backside PRT die is vented to the environment.

Turning now to FIG. 9, there is illustrated processing of the integrated silicon pressure sensor subsequent to FIG. 8 with an isometric top view of an encapsulated device 120 in which the backside PRT die 114 (not shown) and lead frame 100 are encapsulated with a molding compound 122. In particular, after the backside PRT die 114 has been die bonded to flag 104 and wire bonded to selected ones of interior electrical contacts 106, a protective gel may be applied to the topside portion of the PRT die 114 so as protect the top of the die from the environment as described hereinabove, though in selected embodiments, the protective gel is not applied. In either case, a portion of lead frame 100 may then be over-molded or transfer molded with a composite material (e.g., plastic) to create a molded body 122. As formed, the top of the die 114 will be covered with the molding compound 122 and thereby protected from the environment. However, the formation of the molding compound 122 leaves the pressure sensor membrane on the backside PRT die exposed to the environment through the vent hole 102 in the die flag 104. This arrangement is depicted in FIG. 10 which illustrates processing of the integrated silicon pressure sensor subsequent to FIG. 9 with an isometric bottom view of the encapsulated device 124. As shown in FIG. 10, the molding compound 122 is formed to be flush with the exposed die flag 104, the exterior electrical contacts 110 have been bent, and the dam bar 108 has been trimmed. Because the vent hole 102 in the die flag 104 is not covered or blocked by the molding compound 122, the pressure sensor on the backside PRT die is vented directly to the environment. While the bottom of the PRT die is exposed to the environment through the vent hole 102 in the die flag 104 without a protective gel or coating, the top of the PRT die may be covered with a molding compound or gel for protection from the environment using any desired lead frame packaging scheme, including but not limited to QFN (Quad Flat No leads), SOIC (Small-Outline Integrated Circuit), or QFP (Quad Flat Package). However, it will be appreciated that a substrate packaging scheme (such as LGA (Land Grid Array) packaging) could also be used by substituting the lead frame die flag with an exposed pad with a hole in it at the bottom of the substrate.

Figure 11:
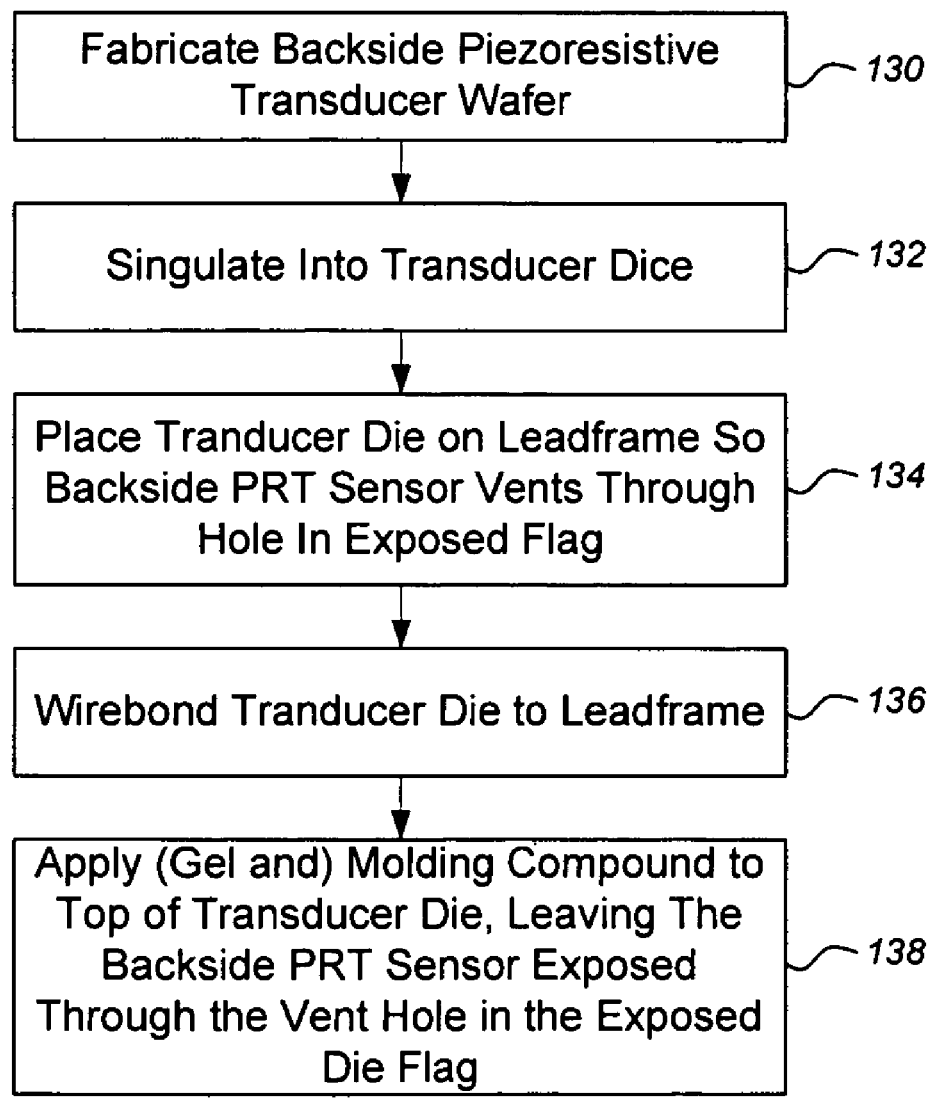
FIG. 11 illustrates an example flow chart depicting a process of fabricating an exposed pad backside pressure sensor package in accordance with selected embodiments of the present invention.

FIG. 11 illustrates an example flow chart depicting a process of fabricating an exposed pad backside pressure sensor package in accordance with selected embodiments of the present invention. The process begins at step 130 with the fabrication of the backside piezoresistive transducer wafer using any desired semiconductor fabrication sequence. At a minimum, the piezoresistive transducer wafer is formed to include sensor circuitry and sensitive metal connection lines (e.g., contact pads) on a topside surface, and to include a single crystal semiconductor layer on a backside surface in which one or more openings are formed to define a single crystal sensor diaphragm which does not require a protective film. At this stage, a cap wafer may also be formed to include a semiconductor layer in which one or more openings are formed to define a reference pressure cavity.

At step 132, the transducer wafer is singulated into one or more transducer dice. For example, the transducer wafer may be singulated into one or more substrate structure dice, and the cap wafer may be singulated into one or more cap structure dice. In selected embodiments, the singulation process is controlled so that the size of each cap structure die is smaller than the substrate structure die, thereby allowing the cap structure die to be affixed to the substrate structure die without covering the contact pads on the topside surface of the substrate structure die.

At step 134, each transducer die is placed on a lead frame structure which includes a die flag having a vent hole formed therein, thereby forming a sensor assembly. The die flag is advantageously configured to be recessed in relation to the remainder of the lead frame structure so that, when finally encapsulated, the die flag is exposed or flush with the exterior surface of the mold encapsulant. At this step, the transducer die is aligned with the vent hole so that the backside PRT sensor in the transducer die can vent through the vent hole in the die flag.

At step 136, the transducer die is electrically connected to the internal lead frame elements, such as by using a wirebonding process to connect the bond pads of the sensor assembly to the internal electrical leads in the lead frame. In selected embodiments, the electrical bond wires are thermosonically bonded to the internal electrical leads and to the bond pads on the transducer die.

At step 138, a molding compound is applied to the top of the transducer die to surround and protect the top of the transducer die, leaving the backside PRT sensor exposed through the vent hole in the exposed flag. Prior to forming the molding compound, a protective gel layer may be formed (as parenthetically indicated) on the topside surface of the transducer die to protect the sensor circuitry, sensitive metal lines and bond wires. However, the protective gel layer need not be formed over the backside sensor diaphragm since it is formed from a single crystal material that is not susceptible to corrosion. Indeed, the protective gel layer need not be formed over the topside surface of the transducer die in selected embodiments, such as when the transducer die can tolerate the molding compound stress. In either case, the molding compound covers the electrical leads, bond pads, and bond wires at the topside surface of the transducer die, thereby preventing corrosive materials or fluids from reaching the sensitive portions of the transducer die. However, by keeping the backside sensor diaphragm and vent hole clear from the protective gel and molding compound, more accurate pressure readings can be made by the backside sensor diaphragm.

By now, it should be appreciated that there has been provided herein a method for fabricating a packaged pressure sensor. The disclosed sensor includes an exposed die flag in which a vent hole is formed. The sensor also includes a pressure sensor transducer die, such as a piezoresistive transducer die formed from a monocrystalline silicon substrate layer in which an opening is formed to define the sensor diaphragm. On the backside of the pressure sensor transducer die, a sensor diaphragm is formed, and on the topside of the pressure sensor transducer die, sensor circuitry is formed. The backside of the pressure sensor transducer is affixed to the exposed die flag so that the sensor diaphragm is directly vented to the environment through the vent hole in the exposed die flag. Electrical connectors are also included in the sensor for electrically coupling the sensor circuitry formed on the topside of the pressure sensor transducer die to the outside world. The electrical connectors may include one or more bond pads formed on the topside of the pressure sensor transducer die, a wire connector connected to each of the one or more bond pads, and a lead frame element connected to each wire connector, where the lead frame element extends through the molded body. The sensor may also include a protective gel covering at least part of the topside of the pressure sensor transducer die without covering the sensor diaphragm on the backside. Finally, the sensor includes a molded body that is formed at least partially around the electrical connectors and around the pressure sensor transducer die without covering the exposed die flag. In selected embodiments, the molded body is a QFN (Quad Flat No leads), SOIC (Small-Outline Integrated Circuit), QFP (Quad Flat Package), or LGA (Land Grid Array) packaging body. As formed, the molded body protects the sensor circuitry formed on the topside of the pressure sensor transducer die from corrosive external environmental conditions. To this end, the die flag may be recessed with respect to a plurality of lead frame elements forming at least part of the electrical connectors so that the plurality of lead frame elements extend through the molded body which is formed to be flush with the exposed die flag.

In another form, there is provided a packaged exposed pressure sensor and associated method for packaging an exposed pressure sensor. In the disclosed methodology, a piezoresistive transducer die is provided which may be formed with a monocrystalline silicon substrate layer having a backside surface in which an opening is formed to define a sensor diaphragm. The PRT die is affixed to a die flag so that a sensor diaphragm formed on a backside of the PRT die is vented through a vent hole formed in the die flag. This can be done by die bonding the backside of the PRT die to a lead frame which includes a recessed die flag that is recessed with respect to a plurality of lead frame elements so that the sensor diaphragm formed on the backside of the PRT die is aligned with the vent hole formed in the die flag and so that the bottom surface of the molded body is flush with the recessed die flag in which the vent hold is formed. After fixing the PRT die to the die flag, circuitry formed on the topside of the PRT die is electrically connected to one or more electrical connectors. In selected embodiments, electrical connections are made by wire coupling (e.g., thermosonically bonding) wire connectors between one or more bond pads formed on the topside of the PRT die and one or more lead frame electrical connectors. Once the electrical connections are made, a molded body is formed at least partially around the one or more electrical connectors and around the PRT die to cover at least the circuitry on the topside of the PRT die and to leave exposed the die flag, where the molded body protects the circuitry formed on the topside of the PRT die from external environmental conditions. In selected embodiments, the molded body is formed by overmolding or transfer molding a composite material to cover at least the circuitry on the topside of the PRT die without covering the vent hole formed in the die flag. Examples of molded bodies include a QFN (Quad Flat No leads), SOIC (Small-Outline Integrated Circuit), QFP (Quad Flat Package), or LGA (Land Grid Array) packaging body. Before forming the molded body, a protective gel may be dispensed or formed over the circuitry on the topside of the PRT die without covering the sensor diaphragm on the backside of the PRT die.

In yet another form, there is provided a packaged pressure sensor and method for making same. As disclosed, the packaged pressure sensor includes a housing with an opening formed in a bottom surface of the housing, where the housing may be implemented as a QFN (Quad Flat No leads), SOIC (Small-Outline Integrated Circuit), QFP (Quad Flat Package), or LGA (Land Grid Array) packaging body. The packaged pressure sensor also includes an exposed pad attached to the bottom surface of the housing to enclose the opening except for a vent hole that is formed in the exposed pad. A backside piezoresistive transducer die having a diaphragm is placed in the enclosed opening and attached to the exposed pad so that the diaphragm is vented through the vent hole. At least a first electrical connector protrudes through said housing that is electrically coupled to the backside piezoresistive transducer die, and may include one or more bond pads formed on the backside piezoresistive transducer die, a wire connector connected to each of the one or more bond pads, and a lead frame element connected to each wire connector, where the lead frame element extends through the housing. In addition, a protective gel may be included to cover one or more circuits or conductors formed on a topside of the backside piezoresistive transducer die without covering the diaphragm on a backside of the backside piezoresistive transducer die.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. While the disclosed MEM devices may be implemented as a gyroscope, the fabrication process described herein is not limited to gyroscopes or any other type of sensor, but is also applicable to any one of numerous MEM devices that include some type of structure that is movably suspended by one or more springs and that is formed by bonding an active wafer to a reference wafer. Non-limiting examples of such devices include various types of accelerometers and switches, optical MEM system components, and other MEM system devices that use drive and sense electrodes. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the process steps may be performed in an alternative order than what is presented. For example, the sequence of wafer bonding steps may be reversed. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A packaged pressure sensor, comprising:
an exposed die flag in which a vent hole is formed;
a pressure sensor transducer die comprising a sensor diaphragm formed on a backside of the pressure sensor transducer die and sensor circuitry formed on a topside of the pressure sensor transducer die, where the backside of the pressure sensor transducer is affixed to the exposed die flag so that the sensor diaphragm is directly vented to the environment through the vent hole in the exposed die flag;
one or more electrical connectors that are electrically coupled to the sensor circuitry formed on the topside of the pressure sensor transducer die; and
a molded body formed at least partially around the electrical connectors and around the pressure sensor transducer die without covering the exposed die flag, where the molded body protects the sensor circuitry formed on the topside of the pressure sensor transducer die from corrosive external environmental conditions.

2. The packaged pressure sensor of claim 1, further comprising a protective gel covering at least part of the topside of the pressure sensor transducer die without covering the sensor diaphragm on the backside.

3. The packaged pressure sensor of claim 1, where the exposed die flag is recessed with respect to a plurality of lead frame elements forming at least part of the electrical connectors so that the plurality of lead frame elements extend through a side surface of the molded body, while a bottom surface of the molded body is formed to be flush with the exposed die flag.

4. The packaged pressure sensor of claim 1, where the pressure sensor transducer die comprises a piezoresistive transducer die.

5. The packaged pressure sensor of claim 1, where the pressure sensor transducer die comprises a piezoresistive transducer die formed from a monocrystalline silicon substrate layer in which an opening is formed to define the sensor diaphragm.

6. The packaged pressure sensor of claim 1, where the one or more electrical connectors comprise:
one or more bond pads formed on the topside of the pressure sensor transducer die;
a wire connector connected to each of the one or more bond pads; and
a lead frame element connected to each wire connector, where the lead frame element extends through the molded body.

7. The packaged pressure sensor of claim 1, where the molded body comprises a QFN (Quad Flat No leads), SOIC (Small-Outline Integrated Circuit), QFP (Quad Flat Package), or LGA (Land Grid Array) packaging body.

8. A method for packaging an exposed pressure sensor, comprising:
affixing a piezoresistive transducer die to a die flag so that a sensor diaphragm formed on a backside of the piezoresistive transducer die is vented through a vent hole formed in the die flag;
electrically connecting circuitry formed on a topside of the piezoresistive transducer die to one or more electrical connectors; and
forming a molded body at least partially around the one or more electrical connectors and around the piezoresistive transducer die to cover at least the circuitry on the topside of the piezoresistive transducer die and to leave exposed the die flag, where the molded body protects the circuitry formed on the topside of the piezoresistive transducer die from external environmental conditions.

9. The method of claim 8, where affixing the piezoresistive transducer die to the die flag comprises die bonding the backside of the piezoresistive transducer die to a lead frame so that the sensor diaphragm formed on the backside of the piezoresistive transducer die is aligned with the vent hole formed in the die flag.

10. The method of claim 8, where affixing the piezoresistive transducer die to the die flag comprises attaching the backside of the piezoresistive transducer die to a lead frame comprising a recessed die flag that is recessed with respect to a plurality of lead frame elements so that a bottom surface of the molded body is flush with the recessed die flag in which the vent hold is formed.

11. The method of claim 8, where the piezoresistive transducer die comprises a monocrystalline silicon substrate layer having a backside surface in which an opening is formed to define the sensor diaphragm.

12. The method of claim 8, where electrically connecting circuitry comprises wire coupling one or more bond pads formed on the topside of the piezoresistive transducer die to one or more lead frame electrical connectors.

13. The method of claim 8, where electrically connecting circuitry comprises thermosonically bonding wire connectors to electrically connect one or more bond pads formed on the topside of the piezoresistive transducer die to one or more lead frame electrical connectors.

14. The method of claim 8, further comprising dispensing a protective gel over the circuitry formed on the topside of the piezoresistive transducer die prior to forming the molded body and without covering the sensor diaphragm on the backside of the piezoresistive transducer die.

15. The method of claim 8, where forming the molded body comprises overmolding or transfer molding a composite material to cover at least the circuitry on the topside of the piezoresistive transducer die without covering the vent hole formed in the die flag.

16. The method of claim 8, where forming the molded body comprises forming a QFN (Quad Flat No leads), SOIC (Small-Outline Integrated Circuit), QFP (Quad Flat Package), or LGA (Land Grid Array) packaging body.

17. A packaged pressure sensor, comprising:
a molded body housing with an opening formed in a bottom surface of the molded body housing;
an exposed pad attached to the bottom surface of the molded body housing to enclose the opening except for a vent hole that is formed in the exposed pad;
a backside piezoresistive transducer die having a diaphragm which is placed in the enclosed opening and attached to the exposed pad so that the diaphragm is vented through the vent hole; and
at least a first electrical connector protruding through said molded body housing that is electrically coupled to the backside piezoresistive transducer die.

18. The packaged pressure sensor of claim 17, where the first electrical connector comprises:
one or more bond pads formed on the backside piezoresistive transducer die;
a wire connector connected to each of the one or more bond pads; and a lead frame element connected to each wire connector, where the lead frame element extends through the molded body housing.

19. The packaged pressure sensor of claim 17, where the molded body housing comprises a QFN (Quad Flat No leads), SOIC (Small-Outline Integrated Circuit), QFP (Quad Flat Package), or LGA (Land Grid Array) packaging body.

20. The packaged pressure sensor of claim 17, comprising a protective gel covering one or more circuits or conductors formed on a topside of the backside piezoresistive transducer die without covering the diaphragm on a backside of the backside piezoresistive transducer die.

* * * * *